(12) United States Patent
Chen et al.

(10) Patent No.: US 7,405,438 B2
(45) Date of Patent: Jul. 29, 2008

(54) CAPACITOR CONSTRUCTIONS AND SEMICONDUCTOR STRUCTURES

(75) Inventors: Shenlin Chen, Boise, ID (US); Trung Tri Doan, Boise, ID (US); Guy T. Blalock, Boise, ID (US); Lyle D. Breiner, Meridian, ID (US); Er-Xuan Ping, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 311 days.

(21) Appl. No.: 10/945,774

(22) Filed: Sep. 20, 2004

(65) Prior Publication Data

US 2005/0042824 A1 Feb. 24, 2005

Related U.S. Application Data

(62) Division of application No. 10/423,111, filed on Apr. 25, 2003, now Pat. No. 6,916,723.

(51) Int. Cl.
*H01L 29/72* (2006.01)

(52) U.S. Cl. .................. 257/306; 257/296; 257/301; 257/303; 257/309; 257/532

(58) Field of Classification Search ................ 257/296, 257/301, 303, 306, 309, 532
See application file for complete search history.

(56) References Cited

U.S. PATENT DOCUMENTS

| 5,418,180 | A | * | 5/1995 | Brown | 438/398 |
|---|---|---|---|---|---|
| 5,913,119 | A | | 6/1999 | Lin et al. | |
| 5,937,314 | A | | 8/1999 | Ping et al. | |
| 5,959,326 | A | * | 9/1999 | Aiso et al. | 257/306 |
| 6,046,083 | A | | 4/2000 | Lin et al. | |
| 6,090,679 | A | | 7/2000 | Lou | |
| 6,121,081 | A | | 9/2000 | Thakur et al. | |
| 6,180,480 | B1 | * | 1/2001 | Economikos et al. | 438/386 |
| 6,187,628 | B1 | | 2/2001 | Thakur et al. | |
| 6,204,142 | B1 | | 3/2001 | Thakur | |
| 6,235,605 | B1 | | 5/2001 | Ping | |
| 6,287,935 | B1 | | 9/2001 | Coursey | |
| 6,312,987 | B1 | | 11/2001 | Han et al. | |
| 6,346,746 | B1 | * | 2/2002 | Agarwal | 257/751 |
| 6,432,772 | B1 | | 8/2002 | Wu et al. | |
| 6,458,652 | B1 | | 10/2002 | Chen et al. | |
| 6,689,668 | B1 | | 2/2004 | el-Hamdi et al. | |
| 2001/0009284 | A1 | | 7/2001 | Yang | |

* cited by examiner

*Primary Examiner*—Edward Wojciechowicz
(74) *Attorney, Agent, or Firm*—Wells St. John P.S.

(57) ABSTRACT

The invention includes a method of forming a rugged semiconductor-containing surface. A first semiconductor layer is formed over a substrate, and a second semiconductor layer is formed over the first semiconductor layer. Subsequently, a third semiconductor layer is formed over the second semiconductor layer, and semiconductor-containing seeds are formed over the third semiconductor layer. The seeds are annealed to form the rugged semiconductor-containing surface. The first, second and third semiconductor layers are part of a common stack, and can be together utilized within a storage node of a capacitor construction. The invention also includes semiconductor structures comprising rugged surfaces. The rugged surfaces can be, for example, rugged silicon.

6 Claims, 5 Drawing Sheets

CAPACITOR CONSTRUCTIONS AND SEMICONDUCTOR STRUCTURES

RELATED PATENT DATA

This patent resulted from a divisional application of U.S. patent application Ser. No. 10/423,111, which was filed Apr. 25, 2003 now U.S. Pat. No. 6,916,723.

TECHNICAL FIELD

The invention pertains to semiconductor structures containing rugged semiconductor materials, and pertains to methods of forming rugged semiconductor-containing surfaces.

BACKGROUND OF THE INVENTION

Rugged semiconductor surfaces are frequently utilized in applications in which it is desired to have an increased surface area. For instance, rugged semiconductor materials are frequently utilized as storage nodes in capacitor constructions.

The semiconductor of a rugged semiconductor material can comprise, consist essentially of, or consist of any element known to have semiconductive properties. The semiconductor will frequently comprise, consist essentially of, or consist of silicon. In applications in which the semiconductor consists essentially of, or consists of silicon, the rugged semiconductor material can be referred to as rugged silicon, and in exemplary applications can be hemispherical grain (HSG) silicon.

Although techniques are known for forming rugged semiconductor surfaces, there is a continuing need to develop improved methodologies for controlling the particular topography associated with a rugged semiconductor surface. In other words, there is a continuing need for controlling the ruggedness of the surfaces. Accordingly, it is desired to develop improved methods for forming rugged semiconductor surfaces.

SUMMARY OF THE INVENTION

In one aspect, the invention encompasses a semiconductor structure. Such structure includes a stack comprising at least three semiconductor layers over a substrate. Two of the three semiconductor layers are adjacent one another, and an interface layer is between the adjacent semiconductor layers. The interface layer can have a thickness of less than or equal to about 10 Å, and can comprise insulative, semiconductive or conductively-doped semiconductive materials. A bottom of the stack is conductively-doped semiconductor material, and a top of the stack comprises a rugged semiconductor-containing surface.

In another aspect, the invention encompasses a method of forming a rugged semiconductor-containing surface. A first semiconductor layer is formed over a substrate, and a second semiconductor layer is formed over the first semiconductor layer. Subsequently, a third semiconductor layer is formed over the second semiconductor layer. Semiconductor-containing seeds are formed over the third semiconductor layer. The seeds are annealed to form the rugged semiconductor-containing surface. The first, second and third semiconductor layers are part of a common stack, and can be together utilized within a storage node of a capacitor construction.

In another aspect, the invention encompasses a method of forming rugged silicon. Silicon-containing seeds are grown over a semiconductor layer. The growing of the seeds comprises two or more depositions of the silicon of the seeds, with the depositions differing relative to one another in at least one process parameter. Such process parameter can include, for example, a relative time of the depositions, and/or a relative vacuum utilized during the depositions.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
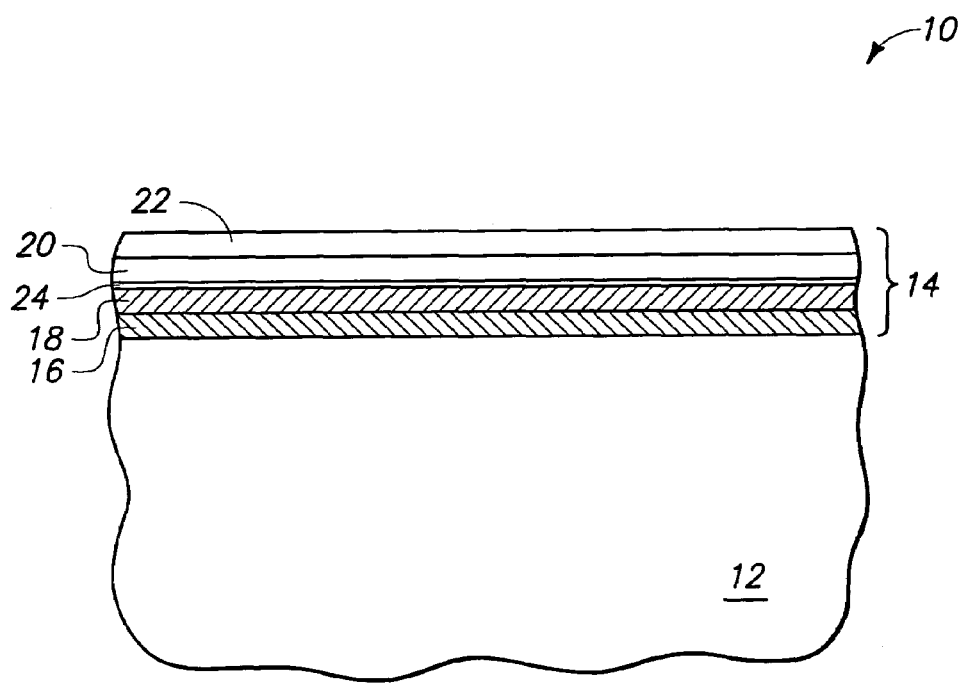
FIG. 1 is a diagrammatic, cross-sectional view of a semiconductor wafer fragment at a preliminary stage of an exemplary method of the present invention.

This disclosure of the invention is submitted in furtherance of the constitutional purposes of the U.S. Patent Laws "to promote the progress of science and useful arts" (Article 1, Section 8).

As discussed in the "Background" section of this disclosure, it is difficult to control the relative size and shape of topographical features when utilizing prior art processes to form rugged semiconductor surfaces (such as, for example, hemispherical grain polysilicon surfaces). One aspect of the present invention is to utilize pulsing processes to provide control of topographical features associated with rugged semiconductor materials. Such control can allow increased surface area to be accomplished, which can lead to improved devices. For instance, the increased surface area can be utilized in a storage node of a container capacitor, which can lead to higher capacitance for the structure than would be obtained if prior art rugged semiconductor structures were utilized.

In order to assist the reader in understanding the process of the present invention, a brief discussion of particular differences between an exemplary embodiment of the present invention and the prior art is provided. A typical prior art process for forming HSG silicon is as follows. Initially, doped polysilicon is provided. An undoped layer of smooth polysilicon is then formed over and physically against the doped polysilicon. Subsequently, the undoped silicon is exposed to a seeding process. The seeding is accomplished in one step, in that seeding materials are provided for an appropriate period of time, and under an appropriate vacuum to form the seeds as a single layer. Subsequently, the seeds and underlying silicon layers are annealed to form the rugged silicon. The seeds and undoped silicon can be doped during the annealing process by out-diffusion of dopant from the underlying doped silicon. Alternatively, and/or additionally, dopant can be implanted into the seeds and undoped silicon to conductively dope the seeds and underlying undoped silicon. The dopant implanting can occur at any suitable time relative to the annealing, including before or after the annealing.

In particular aspects, the present invention differs from the prior art processes in that multiple doped silicon layers can be provided utilizing a pulsed process, and/or multiple non-conductively-doped silicon layers can be provided in a pulsed process. The various layers can differ from one another in the composition of semiconductor material. Also, if the various layers are conductively-doped layers, the layers can differ from one another in the concentration, type and/or chemical constituency of the dopant materials. In particular aspects, interface layers can be provided between one or more of the pulse-deposited layers. The interface layers can be very thin (with exemplary interface layers being less than 10 Å thick, and in some cases being less than 5 Å thick). The interface layers can be utilized as barriers to alleviate and/or prevent dopant migration between adjacent layers during the seeding and/or annealing stages. Additionally, and/or alternatively, the interface layers can be utilized to prevent cross diffusion of constituent materials of the various semiconductor layers during the annealing and/or seeding.

The invention can also include a pulsed process for forming the seeds. Specifically, the seeds can be formed in multiple steps, with the steps varying from one another in one or more process parameters. For instance, a first layer of the seeds can be formed under a first vacuum condition for a first deposition time, and subsequently a second seed layer can be formed under a second vacuum condition which is different than the first, and for a second time which may also be different than the first. The different process parameters could also encompass utilization of different precursors, so that various layers of the seed differ in chemical constituency relative to one another.

The pulsing processes utilized in methodology of the present invention can change a bonding structure of an atom bonding network (Si—Si, Si—P, etc.), and can thus affect rugged semiconductor formation. Temperature, time, pressure, gas flow rate and/or other conditions can be changed during formation of the various base semiconductor layers (either conductively-doped or undoped base layers), as well as during formation of the seeds. Variation of the various parameters can allow optimization of rugged silicon shape, density and size to be achieved for a particular application. Such can allow a rugged semiconductor material to be formed having a larger surface area than prior art materials, and also to be formed having topographical features which allow the surface to be better optimized for a particular application. For instance, a rugged semiconductor surface formed in accordance with the present invention can be included within a container capacitor as a storage node, and can allow a larger capacitance to be achieved from the capacitor than could be achieved utilizing rugged semiconductor materials formed in accordance with prior art methodologies.

Various exemplary aspects of the invention are described with reference to FIGS. 1-3.

Referring initially to FIG. 1, a construction 10 is illustrated at a preliminary processing stage of an exemplary aspect of the present invention. Construction 10 comprises a substrate 12 which can be, for example, a semiconductor substrate. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Although substrate 12 is shown as a single mass, it is to be understood that the substrate can comprise numerous discrete materials. For instance, substrate 12 can comprise an insulative material over monocrystalline silicon.

A stack 14 is formed over substrate 12. The exemplary stack comprises a pair of conductively-doped semiconductor layers (16 and 18); a pair of semiconductor layers which are not conductively-doped (20 and 22); and an interface layer 24 between the upper conductively-doped layer 18 and the lower layer 20 which is not conductively-doped.

The shown stack 14 can be considered to comprise at least three semiconductor layers, and in the shown aspect comprises four semiconductor layers. The various layers can be considered to be a first, second, third and fourth semiconductor layer, which are formed over one another. The layers 16, 18, 20, 22 and 24 which are part of the common stack 14 can be ultimately incorporated into a single circuit device. For instance, the layers can be incorporated into a capacitor and comprised by a storage node of the capacitor.

The semiconductor material of layers 16, 18, 20 and 22 can comprise any suitable semiconductive element, including, for example, one or both of silicon and germanium.

Conductively-doped layers 16 and 18 differ from one another, and can be distinguished from one another. The difference between layers 16 and 18 can be anything which enables the layers to be distinguished from one another, including, for example, (1) one or more of a relative dopant concentration between the layers; (2) a majority dopant type within the layers (for instance, one of the layers can be majority p-type and the other can be majority n-type); (3) the chemical composition of the dopant (for instance, both layers can comprise the same majority dopant type, but can differ from one another in terms of the actual dopant utilized, for instance, if both are n-type majority doped, one can predominately comprise phosphorous and the other predominately comprise arsenic); and (4) the chemical composition of the semiconductor (for instance, one of the layers can comprise silicon/germanium while the other consists of silicon, or both layers can comprise silicon/germanium with the relative amount of germanium differing between the layers).

Layers 16 and 18 can be formed in what can be considered a pulsed process, with layer 16 being first deposited, then one or more process parameters being changed and layer 18 being subsequently deposited. Layers 16 and 18 can be deposited in the same reaction chamber, and within a continuous process occurring without breaking vacuum to the deposition chamber. Layers 16 and 18 can be formed by atomic layer deposition (ALD) processes, chemical vapor deposition process (CVD), or combinations of these and/or other suitable processes. Layers 16 and 18 can be formed to thickness of from about 40 Å to about 1000 Å, and in typical processing each will have a thickness of about 40 Å.

Layers 20 and 22 can differ from one another in any property that enables layers 20 and 22 to be distinguished from one another. For instance, layers 20 and 22 can differ from one another in terms of the semiconductor composition of the layers. One of the layers can comprise silicon/germanium and the other can consist of silicon. Alternatively, both of the layers can comprise silicon/germanium, with the relative amount of germanium differing in one layer relative to the other. Layers 20 and 22 can comprise thicknesses of from about 40 Å to about 1000 Å, and typically each will have a thickness of about 40 Å. Layers 20 and 22 can be formed by any suitable process, including ALD, CVD and/or other processes.

It is noted that layers 20 and 22 are referred to as being not conductively-doped, and such term should not be understood to mean that the layers 20 and 22 contain absolutely no dopant. Rather, a layer which is not conductively-doped is, as is understood in the art, a layer which can contain some dopant, but which contains too little dopant to be considered electrically conductive.

In the discussion above, it should be understood that the semiconductor material of layers 16, 18, 20 and 22 can comprise any element, or combination of elements known to be semiconductive, and in particular aspects can comprise, consist essentially of, or consist of silicon; or in other exemplary aspects can comprise, consist essentially of, or consist of silicon/germanium.

Interface layer 24 separates doped layer 18 from the adjacent layer 20 that is not conductively-doped, and in the shown aspect of the invention is the only material between layers 18 and 20. Interface layer 24 can comprise silicon dioxide, silicon nitride, silicon oxynitride, silicon, germanium, and/or silicon/germanium. If layer 24 comprises a semiconductor, the semiconductor can be, in particular aspects, conductively-doped.

In some applications, layer 24 can consist essentially of, or consist of an insulative material which can function as a dopant barrier between conductively-doped layer 18 and the non-conductively-doped layer 20, and in such aspects can comprise, consist essentially of, or consist of silicon dioxide, silicon nitride or silicon oxynitride.

Layer 24 can be formed over layer 18 by, for example, oxidation of semiconductor material of layer 18, nitridation of the semiconductor material layer 18, or by ALD or CVD of a desired material over layer 18.

In particular aspects, layer 24 has a thickness of less than 10 Å, and more preferably less than 5 Å. A reason for keeping layer 24 thin is so that the layer does not subsequently impede conductivity between layers 18 and 20 in a device ultimately formed to comprise stack 14. Specifically, if stack 14 is ultimately utilized to form a rugged semiconductor surface, it can be desired to subsequently dope layers 20 and 22 so that an entirety of stack 14 is conductively-doped. It can also be desired to have relatively unimpeded electrical conductance from layer 16 to layer 22. Accordingly, it can be desired to have layer 24 formed thin enough so that the layer does not ultimately impede electrical conductance between layers 16 and 22 in a circuit device incorporating stack 14.

A reason for utilizing interface layer 24 at initial processing stages of forming rugged silicon from stack 14 is that it can be difficult to control fabrication of a rugged semiconductor if dopant migrates from the lower doped portions of the stack to the upper portions of the stack during fabrication of the rugged surface. Specifically, the dopant can interfere with the fabrication of the rugged surface, and ultimately affect the resulting topography of the rugged surface.

One solution which would appear to avoid migration of dopant into layers 20 and 22 without utilization of interface layer 24 is to simply not provide any conductively-doped layers within stack 14. However, such solution is typically not practical in that a rugged semiconductor formed utilizing layer 14 is usually intended to be a conductively-doped material throughout an entirety of its thickness (for instance, the rugged material will frequently be utilized as a storage node of a capacitor), and it is generally impractical to implant a conductivity-enhancing dopant through an entire thickness of the rugged material. Accordingly, the application of the rugged material typically starts with a lower portion of the stack utilized for forming the rugged material being conductively-doped so that the lower portion of the rugged semiconductive material later formed from the stack will have the appropriate conductivity doping without need for an implant to penetrate the entire thickness of the stack.

In the shown application, the conductively-doped portion of stack 14 is approximately the lower half of the stack. It is to be understood, however, that in other applications the conductively-doped portion can be less than half the thickness of the stack, and in yet other applications the conductively-doped portion can be more than half the thickness of the stack.

Although interface layer 24 is shown between a conductively-doped layer 18 and a layer 20 which is not conductively-doped, it is to be understood that layer 24 can be formed between conductively-doped layers additionally and/or alternatively to its formation between a conductively-doped layer and a layer not conductively-doped; and also that layer 24 can be formed between a pair of semiconductor layers which are not conductively-doped additionally and/or alternatively to its formation between a conductively-doped layer and a layer which is not conductively-doped. An advantage to forming an interface layer between a pair of layers which are conductively-doped is that the interface layer can prevent dopant migration between the conductively-doped layers to the extent that the layers comprise dopants having different chemical constituencies relative to one another. Also, even if layer 24 is not a dopant barrier layer, the layer can be utilized to modify a behavior of stack 14 during formation of rugged silicon, which can provide additional control of the fabrication of the rugged silicon.

An advantage to forming interface layer 24 between a pair of semiconductor layers which are not conductively-doped is that the interface layer can be a dopant barrier layer which allows the lower of the non-conductively-doped layers to become conductively-doped through out-diffusion from conductively-doped layers below such non-conductively-doped layer, while preventing out-diffusion into the upper non-conductively-doped layer. Alternatively, if layer 24 is not a dopant barrier layer, there can still be advantages to utilizing such layer between the non-conductively-doped layers in that layer 24 can modify behavior of stack 14 during fabrication of rugged semiconductor materials, which can provide additional control of the fabrication of the semiconductor materials.

It is emphasized that although the invention is described as growing a stack upwardly, with lower portions of the stack being conductive and upper portions of the stack being non-conductive, the relative orientations of the non-conductive portions and conductively-doped portions can be changed depending on the orientation of the substrate. Accordingly, the non-conductively-doped portions can be formed laterally outward of conductively-doped portions, or even downwardly of conductively-doped portions in various aspects of the invention. Further, the directional terms upwardly, downwardly, and laterally outwardly are, unless specified otherwise, defined relative to the substrate itself, rather than relative to an outside observer. Accordingly, a layer which is formed over another in the context of this invention, may actually appear to be formed below the other to an observer, depending on the frame of reference of the observer to the substrate.

Although stack 14 is shown to comprise conductively-doped semiconductor materials adjacent one another in one portion of the stack, and non-conductively-doped portions adjacent one another in another portion of the stack, it is to be understood that the conductively-doped portions and non-conductively-doped portions can alternate with one another within the stack in various aspects of the invention. However, a portion of stack 14 most proximate to the supporting substrate 12 will typically be conductively-doped, and the portion having an exposed surface will typically be non-conductively-doped. Accordingly, the shown lowermost portion 16 is conductively-doped, and the shown uppermost portion 22 is not conductively-doped.

The total number of semiconductor layers 16, 18, 20 and 22 utilized in stack 14 (i.e. the layers typically having a thickness of from 40 Å to 1000 Å) will typically be from about 4 to about 10, with from about 2 to about 5 conductively-doped layers typically being utilized, and from about 2 to about 5 non-conductively-doped layers typically being utilized. The total number of interface layers can therefore typically be from about 1 to about 9.

Figure 2:
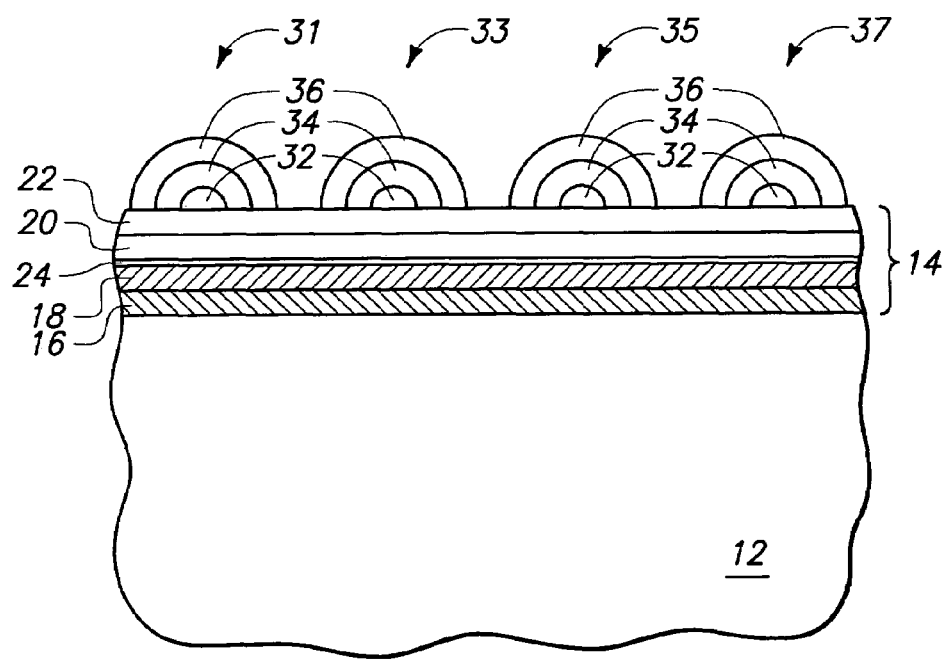
FIG. 2 is a view of the FIG. 1 wafer fragment shown at a processing stage subsequent to that of FIG. 1.

Referring to FIG. 2, seeds 31, 33, 35, and 37 are formed over an exposed upper surface of non-conductively-doped semiconductor layer 22, and in the shown embodiment are formed physically against the upper surface of layer 22. Since layers 16, 18 and 20 are covered by layer 22, the seeds are not formed against any surfaces of layers 16, 18 and 20. Seeds 31, 33, 35 and 37 comprise semiconductor material, and in particular aspects can comprise, consist essentially of, or consist of silicon. The seeds comprise multiple layers 32, 34 and 36. The various layers are distinguishable from one another in at least one property. Such property can be a physical parameter (such as, for example, density), and/or a chemical parameter (such as, for example, composition). The various layers of the seeds are formed by growing the seeds in multiple depositions, with the depositions differing relative to one another in at least one process parameter. In the shown exemplary aspect of the invention, the seeds have been grown with three different depositions to form three different layers. However, it is to be understood that the seeds can be grown generally with two or more depositions.

The different process parameter utilized in growing one layer of the seeds relative to another can include, for example, a relative time of the deposition, a relative vacuum utilized during the deposition, and/or a change in the composition of precursor utilized in the deposition. A change in vacuum and/or deposition time can result in a change of density of a layer relative to previously-deposited layers, and a change in precursor composition can result in a change of the chemical composition of the layer relative to previously deposited layers. The vacuum utilized in forming layers 32, 34 and 36 will typically be from about 1 mTorr to about 50 mTorr and a deposition time will typically be from about 1 minute to about 5 minutes. The precursor can be a silicon-containing material (such as silane), a germanium-containing material, or a combination of silicon-containing materials and germanium-containing materials. The total number of layers formed for given seed will typically be formed within a total time of about 15 minutes.

The utilization of multiple different layers within the seeds can enable control of shape and density of the seeds, which ultimately enables additional control of the topography of a rugged semiconductor surface formed utilizing the seeds.

After seeds 31, 33, 35 and 37 are formed, construction 10 is subjected to an appropriate anneal to form a rugged semiconductor surface from the seeds. Such anneal will typically be conducted for a time of about 30 minutes at a temperature of from about 550° C. to about 610° C., under an appropriate inert gas (such as, for example, $N_2$, He, or $H_2$). Also, seeds 31, 33, 35 and 37, together with non-conductively doped layers 20 and 22, will be subjected to an implant of conductivity-enhancing dopant to convert layers 20, 22, 32, 34 and 36 to electrically conductive materials. The doping can be conducted before or after the anneal.

Figure 3:
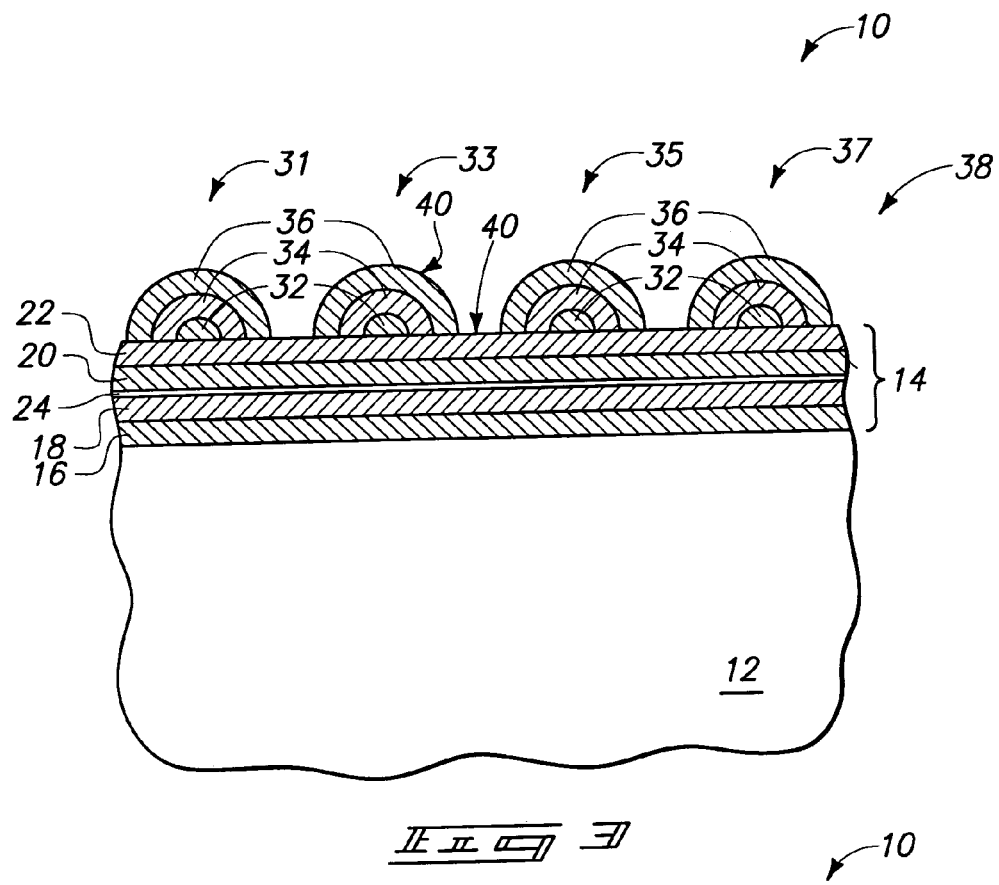
FIG. 3 is a view of the FIG. 1 wafer fragment shown at a processing stage subsequent to that of FIG. 2.

FIG. 3 shows construction 10 after an appropriate anneal, and after the doping of layers 20, 22, 32, 34 and 36. Seeds 31, 33, 35 and 37, together with stack 14, form a rugged semiconductor material 38 having a surface topography 40 which extends across exposed portions of layer 22 and exposed portions of layer 36. It is to be understood, however, that in particular embodiments seeds 31, 33, 35 and 37 can grow to contact one another, and accordingly there would not be exposed portions of layer 22 along the topographical surface.

Layers 16, 18, 20, 22, 24, 32, 34 and 36 are shown to remain distinguishable from one another in the final construction of FIG. 3. In some aspects of the invention, diffusion between various of the layers can cause differences between the layers to be reduced, or even eliminated, such that various of the layers are no longer distinguishable relative to one another at the final stage of the processing shown in FIG. 3. In other aspects, the differences can remain relative to at least some of the layers, so that at least some of the layers are distinguishable relative to one another at the processing stage of FIG. 3. Regardless, the utilization of multiple different layers in the processing sequence of FIGS. 1-3 can provide control of the surface topography of a rugged semiconductor material that does not exist in prior art processes.

Figure 4:
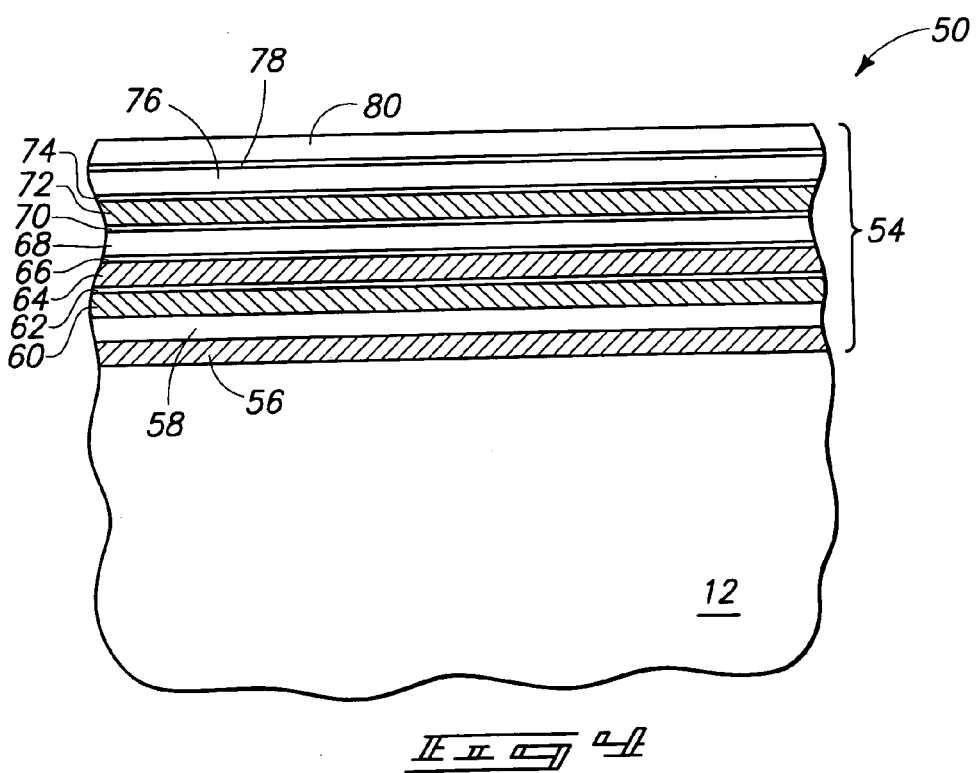
FIG. 4 is a view of a semiconductor wafer fragment shown at a preliminary processing stage in accordance with an exemplary second embodiment of the present invention.

FIG. 4 shows a construction 50 at a processing stage similar to that described previously with reference to FIG. 1, and in referring to construction 50 identical numbering will be utilized as was used above in describing construction 10 of FIG. 1, where appropriate. Construction 50 comprises a substrate 12, and a stack 54 of various layers over substrate 12. The layers within stack 54 are labeled as 56, 58, 60, 62, 64, 66, 68, 70, 72, 74, 76, 78 and 80. Layers 56, 60, 64 and 72 are conductively-doped semiconductor layers, which can comprise constructions identical to those described previously with reference to layers 16 and 18 of FIG. 1. Layers 58, 68, 76 and 80 are semiconductor layers which are not conductively-doped, and can comprise constructions identical to those described above with reference to layers 20 and 22 of FIG. 1. Layers 62, 66, 70, 74 and 78 are interface layers, and can comprise constructions identical to those described previously with reference to layer 24 of FIG. 1.

FIG. 4 illustrates that a non-conductively-doped semiconductor layer can be provided between a pair of conductively-doped semiconductor layers in particular aspects of the invention (for instance, layer 58 is between layers 56 and 60). FIG. 4 also illustrates that a conductively-doped semiconductor layer can be provided between a pair of non-conductively-doped semiconductor materials in particular aspects of the invention, (for instance, layer 72 is between layers 68 and 76). Additionally, FIG. 4 illustrates that interface materials can be provided between a pair of conductively-doped semiconductor layers (for instance, layer 62 is between layers 64 and 66), and that an interface material can be provided between a pair of non-conductively-doped semiconductor layers (for instance, interface layer 78 is between layers 76 and 80).

Stack 54 can be subjected to processing similar to that described above with reference to FIGS. 2 and 3 to form a rugged semiconductor material comprising the various layers of stack 54.

In exemplary aspects of the invention, the interface layers can be considered to separate adjacent semiconductor layers. In accordance with the above-described exemplary constructions of the semiconductor layers and interface layer, it is to be understood that numerous combinations of interface layers and semiconductor layers can be utilized in accordance with various aspects of the invention. For instance, the adjacent semiconductor layers can consist of silicon or doped silicon and the interface layer can comprise, consist essentially of, or consist of Si/Ge. Also, the adjacent semiconductor layers can be conductively-doped, and the interface layer can be a semiconductor material which is not conductively-doped. Such non-conductively-doped interface semiconductor material can comprise, for example, germanium and/or silicon.

Figure 5:
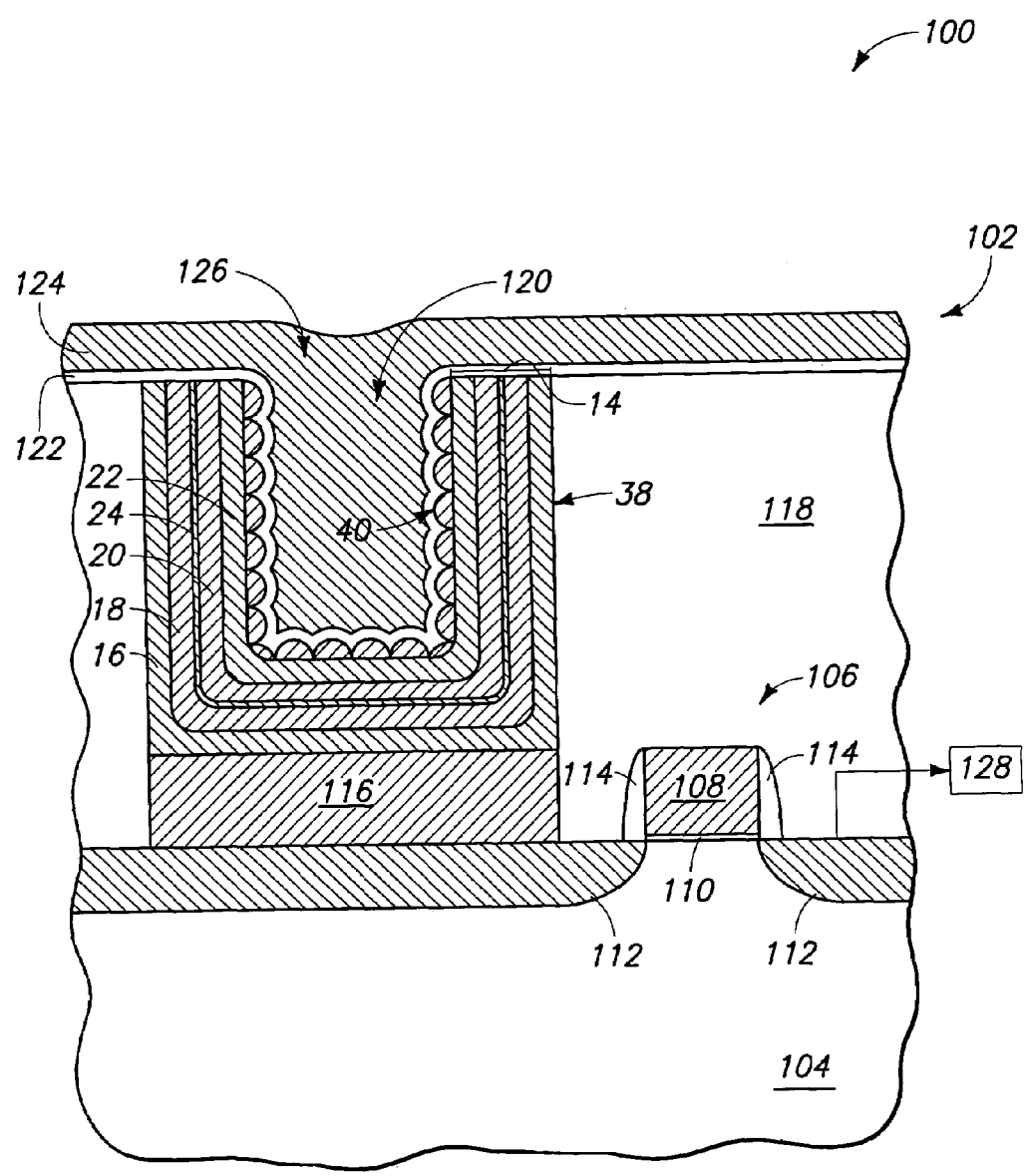
FIG. 5 is a diagrammatic, cross-sectional view of a semiconductor wafer fragment illustrating an exemplary DRAM cell formed in accordance with an aspect of the present invention.

FIG. 5 illustrates a semiconductor construction 100 comprising the rugged semiconductor material 38 of FIG. 3 incorporated into a DRAM cell 102.

DRAM cell 102 comprises a substrate 104. Substrate 104 can comprise, for example, lightly-doped monocrystalline silicon. A transistor device 106 is associated with substrate 104 and comprises a transistor gate 108 separated from substrate 104 by a suitable insulative material 110, and a pair of source/drain regions 112 extending into substrate 104. Although transistor gate 108 is shown to be homogenously conductive, it is to be understood that the gate can, in accordance with conventional practices, comprise multiple layers of conductive materials, and also that the gate can comprise an insulative cap (not shown) over a top of the gate. Sidewall spacers 114 are shown adjacent sidewalls of gate 108.

A conductive pedestal 116 extends to electrically contact one of the source/drain regions 112.

An insulative material 118 is over gate 108, and an opening 120 extends through insulative material 118 to conductive pedestal 116.

Rugged semiconductor material 38 is formed within opening 120 to define a storage node of a container capacitor construction.

A dielectric material 122 extends within opening 120 and conformally along the roughened surface 40 of rugged semiconductor construction 38.

A second capacitor electrode 124 is provided over dielectric material 122 and separated from the first capacitor electrode (i.e. the storage node comprising construction 38) by the dielectric material 122.

Dielectric material 122 can comprise any suitable dielectric material, including, for example, silicon nitride, silicon dioxide, or various high-k materials. Capacitor electrode 124 can comprise any suitable electrically conductive material, including, for example, various metals, metal compounds, and/or conductively-doped semiconductor materials.

Storage node 38, dielectric material 122 and capacitor electrode 124 together define a capacitor construction 126 which is in electrical connection with one of the source/drains of transistor device 106. The other of the source/drains 112 is in electrical connection with a bitline 128.

Utilization of methodology of the present invention enables the ruggedness of surface 40 to be better controlled than it could be utilizing prior art processes. Such can enable capacitor construction 126 to have a higher capacitance than a capacitor formed in the same opening utilizing a storage node formed in accordance with prior art processes. As discussed previously, surface 40 can consist of a surface of the seeds 31, 33, 35 and 37 described previously with reference to FIGS. 2 and 3, or can comprise surfaces of the seeds together with a surface of semiconductor material 22. In either event, rugged surface 40 can comprise silicon, consist essentially of silicon, or consist of silicon.

A circuit device comprising rugged semiconductor material formed in accordance with methodology of the present invention can be utilized in numerous assemblies, including, for example, computer systems and other electronic systems.

Figure 6:
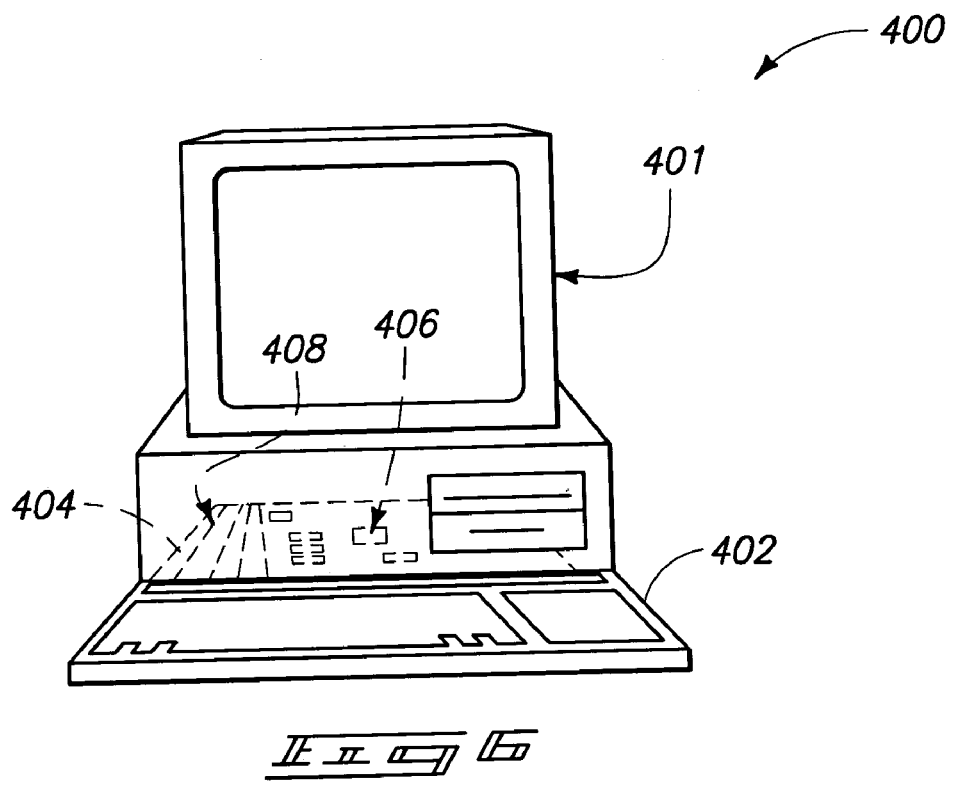
FIG. 6 is a diagrammatic view of a computer illustrating an exemplary application of the present invention.
Figure 7:
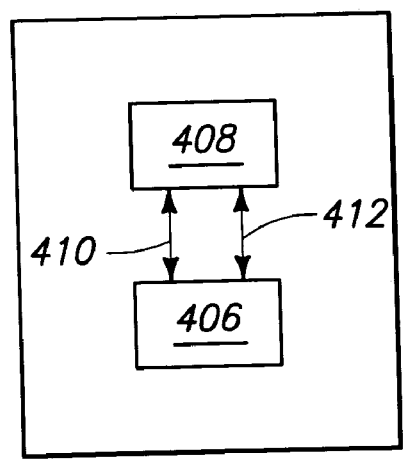
FIG. 7 is a block diagram showing particular features of the motherboard of the FIG. 6 computer.

FIG. 6 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above, including, for example, the DRAM unit cell described with reference to FIG. 5. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 7. In such block diagram, the addressing circuitry is illustrated as 410 and the read circuitry is illustrated as 412.

In particular aspects of the invention, memory device 408 can correspond to a memory module. For example, single in-line memory modules (SIMMs) and dual in-line memory modules (DIMMs) may be used in the implementation which utilize the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Figure 8:
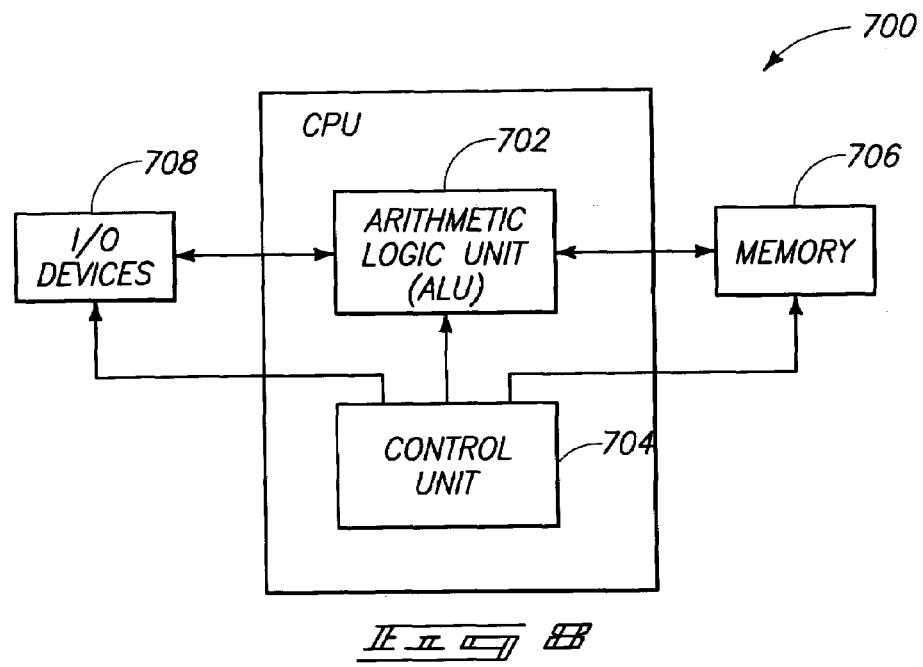
FIG. 8 is a high-level block diagram of an electronic system according to an exemplary aspect of the present invention.

FIG. 8 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include DRAM cells in accordance with various aspects of the present invention.

Figure 9:
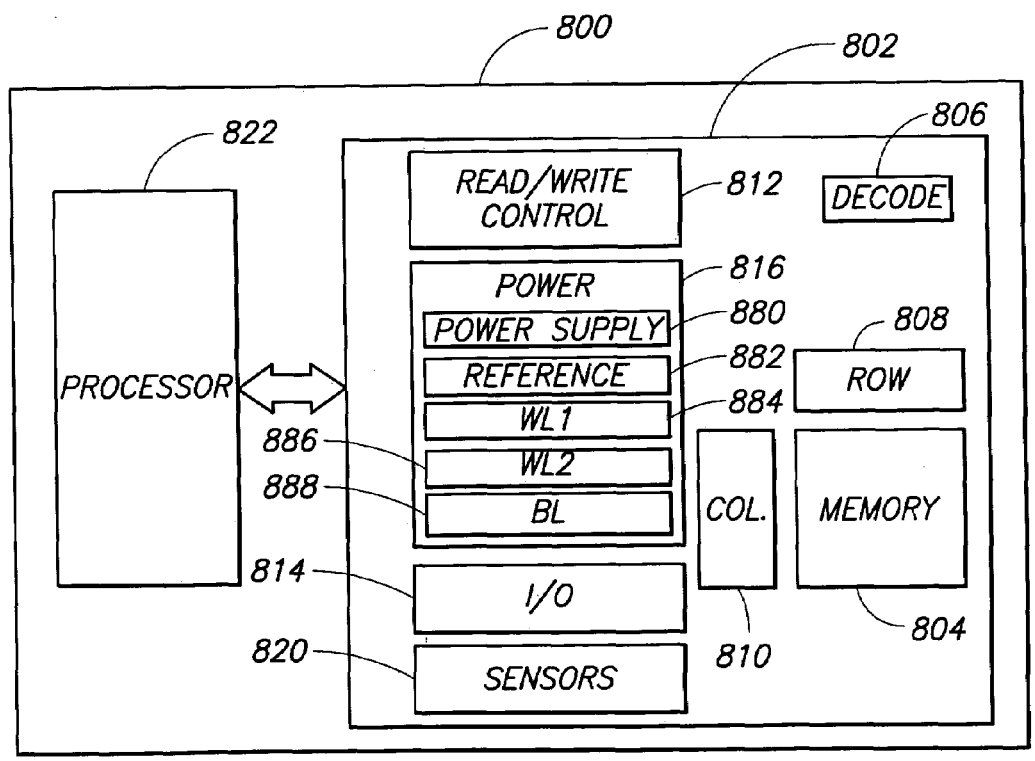
FIG. 9 is a simplified block diagram of an exemplary electronic system according to an aspect of the present invention.

FIG. 9 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first word-line with pulses, circuitry 886 for providing the second word-line with pulses, and circuitry 888 for providing the bitline with pulses. The system 800 also includes a processor 822, or memory controller for memory accessing.

The memory device 802 receives control signals from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a DRAM cell of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A capacitor construction, comprising:
   a first capacitor electrode, the first capacitor electrode including a stack comprising at least three semiconductor layers, two of the three semiconductor layers being adjacent one another; a bottom of the stack being conductively-doped semiconductor material and an outer surface of the stack being a rugged semiconductor surface, there being an interface layer in the stack, the interface layer being between the adjacent semiconductor layers; wherein the conductively-doped semiconductor material of the bottom of the stack does not directly contact the rugged semiconductor outer surface of the stack;
   at least one dielectric material over the first capacitor electrode; and
   a second capacitor electrode over the at least one dielectric material.

2. The capacitor construction of claim 1 wherein the rugged semiconductor surface comprises silicon.

3. The capacitor construction of claim 1 wherein the interface layer has a thickness of less than or equal to about 10 Å.

4. The capacitor construction of claim 1 wherein the interface layer comprises silicon dioxide.

5. A capacitor construction, comprising:
   a first capacitor electrode, the first capacitor electrode including a stack comprising at least three semiconductor layers, two of the three semiconductor layers being adjacent one another; a bottom of the stack being conductively-doped semiconductor material and an outer surface of the stack being a rugged semiconductor surface, there being an interface layer in the stack, the interface layer being between the adjacent semiconductor layers; the conductively-doped semiconductor material of the bottom of the stack not being in direct contact with the rugged semiconductor surface;
   at least one dielectric material over the first capacitor electrode;
   a second capacitor electrode over the at least one dielectric material; and
   wherein the interface layer comprises silicon nitride.

6. A capacitor construction, comprising:
   a first capacitor electrode, the first capacitor electrode including a stack comprising at least three semiconductor layers, two of the three semiconductor layers being adjacent one another; a bottom of the stack being conductively-doped semiconductor material and an outer surface of the stack being a rugged semiconductor surface, there being an interface layer in the stack, the interface layer being between the adjacent semiconductor layers; the conductively-doped semiconductor material of the bottom of the stack not being in direct contact with the rugged semiconductor surface;
   at least one dielectric material over the first capacitor electrode;
   a second capacitor electrode over the at least one dielectric material; and
   wherein the adjacent semiconductor layers consist of silicon or doped silicon, and the interface layer comprises Si/Ge.

* * * * *